United States Patent [19]

Reindel

[11] 4,199,716

[45] Apr. 22, 1980

[54] MICROWAVE HAZARD ALARM

[76] Inventor: John Reindel, 4060 Mount Brundage, San Diego, Calif. 92111

[21] Appl. No.: 879,255

[22] Filed: Feb. 21, 1978

[51] Int. Cl.$^2$ .......................... G01R 31/02; H04B 1/16
[52] U.S. Cl. ....................................... 324/95; 340/600
[58] Field of Search ................ 325/67, 364, 363, 466, 325/455; 340/539, 600; 324/95, 96; 343/703.5 PD

[56] References Cited

U.S. PATENT DOCUMENTS

| | | | |
|---|---|---|---|
| 3,783,448 | 1/1974 | Brodwin | 324/95 |
| 3,873,981 | 3/1975 | Bloice | 343/703 |
| 3,919,638 | 11/1975 | Belden, Jr. | 324/95 |
| 3,927,375 | 12/1975 | Lanoe et al. | 325/363 |
| 3,940,699 | 2/1976 | Emgushov | 325/364 |
| 4,032,910 | 6/1977 | Hollway et al. | 325/363 |
| 4,044,303 | 8/1977 | Reindel | 324/95 |

Primary Examiner—Robert L. Griffin
Assistant Examiner—Jin F. Ng
Attorney, Agent, or Firm—William J. Smith

[57] ABSTRACT

A microwave hazard alarm that indicates the presence of microwave radiation from microwave ovens or other transmitting sources by means of a light indicator. The alarm comprises a handheld microwave receiver including an antenna, a detector, a battery powered amplifier, a light emitting diode and a unique circuit connecting the components on a small printed circuit board. The indicating light emitting diode (LED) blinks on and off periodically when the detected microwave power level is safe and below a predetermined power level. At greater power levels the LED stops blinking and glows continuously.

11 Claims, 3 Drawing Figures

MICROWAVE HAZARD ALARM

BACKGROUND OF THE INVENTION

The present invention relates generally to microwave radiation detectors and means for indicating the presence of microwave sources. Typically a microwave oven employs a magnetron tube and a power supply consisting of a high voltage transformer and a diode rectifier. The power is not filtered and pulse modulates the magnetron on and off. The microwave fields leaking from the microwave ovens can therefore be measured by simple receivers comprised of antennas, rectifying diodes, amplifiers and indicating devices. The commonly used indicating devices consist of current or volt meters which are relatively large and costly mechanical devices having a limited dynamic range and requiring some degree of skill to correctly interpret the indication. Most owners of microwave ovens therefore do not have means for checking the leakage of their oven.

SUMMARY OF THE INVENTION

The present invention relates to a low cost, handheld, battery powered device for detection of microwave oven leakage or other r.f. modulated signals. The device is intended as a means for indicating the presence of microwave radiation and, more particularly, for making periodic checks of microwave ovens to prevent toxic effects of high microwave radiation. The detector is sensitive enough to show the presence of microwave oven radiation by its normal leakage at a distance of 20 feet and can thus serve as a warning for people with pacemakers. The leakage detector is equipped with a Light Emitting Diode (LED) that serves as an indicator. In a field of radiation with low or acceptable power levels, from about 0.01 to 2 mw/cm$^2$, for example, the LED indicator will blink on and off. At higher power levels the indicator will glow continuously.

STATEMENT OF THE OBJECTS OF THE INVENTION

It is the primary object of the present invention to disclose a novel, low cost, battery powered radio frequency detection device particularly suitable for home use in checking the radiation leakage of microwave ovens.

It is a further object of the present invention to disclose an r.f. device that is highly sensitive and employs amplification and a feedback circuit that turns a light emitting diode on at very low received signal levels.

It is also the object of the present invention to disclose an oscillating circuit that causes a LED to blink at a constant rate when a received signal is above a low threshold and below a saturation level.

It is a further object of the present invention to disclose a detecting device that gives a constant or steady light indication from the same LED when the power level of the microwave field exceeds a threshold, that can be designed to fall at about 2 mw/cm$^2$.

It is furthermore the object of the present invention to disclose a battery powered indicating device that automatically shows that the device is in an operating condition whenever it is momentarily activated with a switch by giving a single flash of light.

Other objects, advantages and novel features of the invention will become apparent from the following detailed description of the invention when considered in conjunction with the accompanying drawings.

DESCRIPTION OF THE PREFERRED EMBODIMENT

Figure 1:
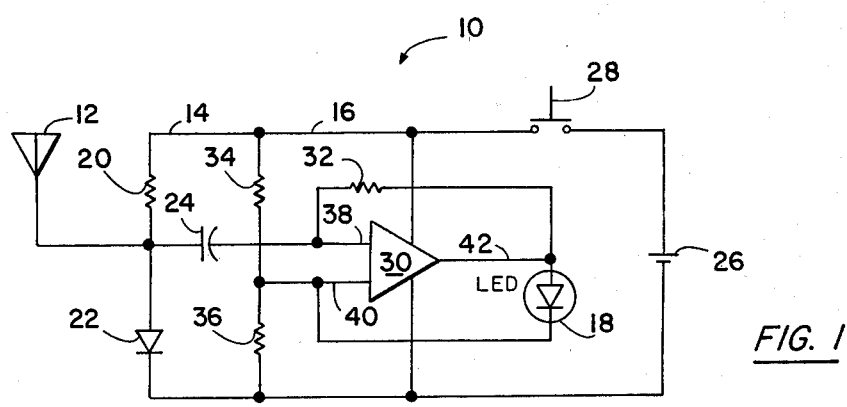
FIG. 1 is a schematic circuit diagram of the detector of the present invention.

Referring now to FIG. 1, the microwave hazard alarm 10 of the present invention comprises an antenna 12, a detector circuit 14, an operational amplifier circuit 16, and an indicating diode 18.

The antenna 12 may be a probe, a spiral, a half wave dipole with a balun or any other r.f. structure that serves to pick up r.f. signals in the desired frequency range. Preferably, the antenna is inexpensive and sufficiently small to be handheld.

The detector circuit 14 includes a bias resistor 20, a forward biased detector diode 22 of the square law type, and a coupling capacitor 24. Forward bias current is supplied by a battery 26, e.g., a 9 volt source. The circuit is switched on by means of a momentary push button switch 28.

The amplifier circuit 16 includes an integrated operational amplifier 30, a negative feedback resistor 32 and two resistors 34 and 36 for biasing the amplifier. The circuit and the antenna can be implemented on a copper clad circuit board (not shown) of small size in many different configurations. The diode 22 detects the amplitude modulated microwave signals picked up by the antenna 12. Capacitor 24 couples the signals to the amplifier inverting input terminal 38. The bias resistor 20 and the coupling capacitor 24 also comprise an R-C timing circuit with the time constant given by the product of the component values thereof.

The amplifier 30 is an integrated circuit differential amplifier which may comprise the currently commercially available 741 type. The non-inverting input terminal 40 is biased by resistors 34 and 36 at, for instance, 3 volts. The light emitting diode 18 has its anode connected to the output terminal 42 and its cathode connected to the non-inverting input terminal 40. The negative feedback resistor 32 determines the amplifier gain; it typically has a value of 1 Megohm to give the amplifier its maximum available gain of, for instance, 40 dB. The amplifier circuit is stable with very low input signals as the negative feedback provides stability and holds terminals 38 and 40 nominally at 3 volts in the preferred embodiment.

Figure 2:
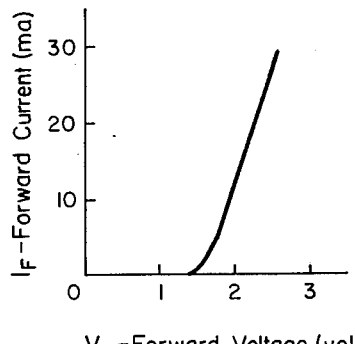
FIG. 2 is a graph of the current voltage characteristic of a typical Light Emitting Diode.

Referring now to FIG. 2 it is seen that a typical LED does not conduct until the forward voltage is raised to a first voltage level of, for instance, 1.8 volts and that the current increases sharply with an increase in the forward voltage beyond 2 volts.

Referring now again to FIG. 1, an input microwave signal of sufficient amplitude will, after detection, cause the amplified signal at output terminal 42 to rise until the voltage across the LED exceeds the threshold, 1.8 volts, for instance. The LED 18 is thereby caused to conduct. Momentarily this will have a positive feedback effect and the output voltage at 16 will further increase causing the LED 18 to conduct more heavily until the amplifier is saturated. In a period of high conduction of LED 18 the indicator is either a bright or blinking light and the intensity is determined by the LED 18 characteristics, the saturated terminal voltage at 42 and the value of resistor 36. The duration of the period is governed by the time constant of the R-C circuit including capacitor 24 and feedback resistor 32. Once capacitor 24 is discharged and the voltage on terminal 38 drops below that of terminal 40, LED 18 ceases to conduct. Capacitor 24 is then charged up again through resistor 20 and the LED 18 will once again start to conduct if the microwave signal after amplification brings the output voltage at 42 above the diode threshold. With, for instance, the resistors 20 and 32 having values of 1 Megohm each and the capacitor 24 having a capacitance of 0.2 microfarad, the rate of blinking light is about ⅛ second. When the signal input is removed either by turning the microwave source off or by removing the device from the field of radiation, the LED 18 stops conducting, the circuit conditions return to normal, and amplifier 30 returns to linear gain operation.

When the device is turned on by the push button switch 28 and current starts to flow in the biasing networks for the detector diode 22 and the amplifier 30, a positive transient voltage at terminal 38 automatically brings the LED 18 into momentary conduction, such that a single blink is produced before the detecting device is stablilized and ready for normal indication of microwave signals. This turn-on blink thus shows the condition of the battery and the amplifier whenever the operator wishes to make a test to insure that the detector 10 is fully operational.

Figure 3:
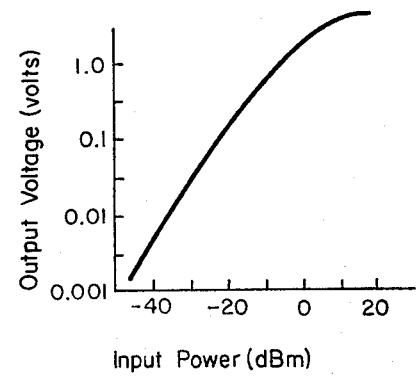
FIG. 3 is a graph of the Dynamic Transfer Characteristics of a typical microwave detector diode.

Referring now to the detector diode dynamic transfer characteristic of FIG. 3, it can be seen that with input r.f. power levels greater than 1 milliwat (0 dBm) the output voltage continues to rise to voltages greater than 1 volt. Referring again to FIG. 1 and considering the case where the input signal is very high or above 0 dBm, it can be seen that a high detected voltage will bring the LED 18 into conduction regardless of the bias voltage at the anode of diode 18 established by resistor 20. At sufficiently high r.f. signal levels the detected voltage keeps the LED 18 conducting continuously and it emits a steady light. At signal levels slightly below that saturation level the rate of blinking will be increased because capacitor 24 does not charge through the full normal operating voltages.

The saturation characteristics depend on the dynamic behavior of the diode 26. By selecting the diode, the size of the antenna and the gain characteristics it is possible to set the device saturation and the power level at which the LED 18 stays lit to a specified level. For testing a microwave oven the level may be set at 2 mw/cm$^2$ to comply with federal standards.

Thus a simple low cost device for detecting and indication of modulated microwave radiation has been disclosed. The detectors' high sensitivity is obtained by means of amplification and the positive feedback network. The indicating device is simple yet provides the information most needed by the lay operator. It blinks when low and relatively non-toxic microwave signals are present, and it glows continuously when placed in a field of dangerously high radiation. Furthermore it has a built-in test feature that provides a quick assurance to the operator that the instrument is functioning by a single blink whenever the device is turned on.

Obviously many modifications and variations of the present invention are possible in the light of the above teachings. It is therefore to be understood that within the scope of the appended claims the invention may be practiced otherwise than as specifically described above.

What is claimed is:

1. A microwave radiation detector comprising: first means for receiving microwave radiation; means for indicating the presence of microwave radiation; second means operably coupled between said first means and said indicating means for providing a first output to said indicating means in response to the reception by said first means of microwave radiation having a power level below a predetermined level and for providing a second output to said indicating means in response to the reception by said first means of microwave radiation at or above said predetermined level; said second means comprising
   a detector diode connected to said first means;
   a differential amplifier having an output, an inverting input and a non-inverting input, said output being connected to said indicating means;
   and an R-C timing circuit connected to said first means and to said differential amplifier; said indicating means being connected directly and operatively to said differential amplifier output and directly and operatively to said said differential amplifier non-inverting input; whereby said indicating means provides a first indication in response to received microwave radiation below said predetermined level and provides a second indication in response to received microwave radiation at or above said predetermined level.

2. The detector of claim 1 further including:
   a resistor connected between said differential amplifier output and said differential amplifier inverting input.

3. The detector of claim 2 wherein said indicating means is a light emitting diode.

4. The detector of claim 3 wherein said first indication comprises periodic illumination and said second indication comprises continuous illumination from said light emitting diode.

5. The detector of claim 1 wherein:
   said detector diode includes an anode and a cathode;
   said R-C timing circuit includes a capacitor having a first terminal thereof connected to said detector diode anode and a second terminal thereof connected to said differential amplifier inverting input.

6. A microwave radiation detector comprising: first means for receiving microwave radiation;
   means for indicating the presence of microwave radiation; second means operably coupled between said first means and said indicating means for providing a first output to said indicating means in response to the reception by said first means of microwave radiation having a power level below a predetermined level and for providing a second output to said indicating means in response to the reception by said first means of microwave radiation at or above said predetermined level;
   whereby said indicating means provides a first indication in response to received micowave radiation below said predetermined level and provides a second indication in response to received microwave radiation at or above said predetermined level; said second means comprising a detector diode connected to said first means, a differential amplifier having its output connected to said indicating means, and an R-C timing circuit connected to said first means and to said differential amplifier;

a d.c. source;

switch means having a first contact thereof connected to a first terminal of said d.c. source and a second contact connected to said R-C timing circuit for providing power to said second means such that upon actuation of said switch means, said second means provides a third output to said indicating means, said indicating means providing a third indication in response to said third output.

7. A microwave radiation detector comprising: first means for receiving microwave radiation;

means for indicating the presence of microwave radiation;

second means operably coupled between said first means and said indicating means for providing a first output to said indicating means in response to the reception by said first means of microwave radiation having a power level below a predetermined level and for providing a second output to said indicating means in response to the reception by said first means of microwave radiation at or above said predetermined level;

whereby said indicating means provides a first indication in response to received microwave radiation below said predetermined level and provides a second indication in response to received microwave radiation at or above said predetermined level;

a switch having a first contact connected to said second means and having a second contact;

a d.c. source connected to said second contact and to said second means;

whereby in response to actuation of said switch said indicating means provides a third indication.

8. An indicator of r.f. radiation comprising:

antenna means for receiving radio frequency signals;

a coupling capacitor having a first terminal connected to said antenna means and having a second terminal;

a differential amplifier having a first input connected to said coupling capacitor second terminal and having a second input and an output;

a resistive biasing network connected to said differential amplifier second input;

a d.c. source connected between said resistive biasing network and ground;

a detector diode connected between said coupling capacitor first terminal and ground;

a light emitting diode connected between said differential amplifier output and said differential amplifier second input; and a resistor connected between said d.c. source and said coupling capacitor first terminal.

9. The indicator of claim 8 wherein said d.c. source includes normally open switch means actuable to a closed position to thereby charge said coupling capacitor and energize said differential amplifier.

10. The indicator of claim 9 further including a negative feedback resistor connected between said differential amplifier output and said differential amplifier first input.

11. The indicator of claim 10 wherein said resistive biasing network comprises a first resistor connected between said switch means and said differential amplifier second input and a second resistor connected between said differential amplifier second input and ground.

* * * * *